Sept. 2, 1969 F. HUGLE 3,465,150

METHOD OF ALIGNING SEMICONDUCTORS

Filed June 15, 1967 2 Sheets-Sheet 1

Sept. 2, 1969 F. HUGLE 3,465,150

METHOD OF ALIGNING SEMICONDUCTORS

Filed June 15, 1967 2 Sheets-Sheet 2

United States Patent Office 3,465,150

Patented Sept. 2, 1969

3,465,150

METHOD OF ALIGNING SEMICONDUCTORS

Frances Hugle, 3818 Thrush Court, Santa Clara, Calif. 95051; assignor to Frances Hugle, trustee of Frances Hugle Trust Filed June 15, 1967, Ser. No. 646,371

Int. Cl. G01t *1/16*

U.S. Cl. 250—83.3 8 Claims

ABSTRACT OF THE DISCLOSURE

The method of aligning a semiconductor device for face bonding to a substrate. The device is illuminated with infra-red light passing through it, which reveals a pattern of electrical connections thereon and on a substrate for viewing by microscope means. Apparatus for accomplishing the method includes a source of infra-red energy, a filter to pass only infra-red light, optical elements for directing the infra-red light to the device and substrate, and to view an image of the patterns of connections. An infra-red to visible light converter is typically employed at the end of the infra-red optical path, as are mechanical means for aligning the patterns.

This invention relates to a method and apparatus employing infra-red light to align a semiconductor with respect to a package or substrate prior to attaching said semiconductor to the package or substrate in a face bonding operation.

Until recently semiconductor devices were wired to their packages with fine wires of gold or aluminum that were welded at one end to the semiconductor and at the other end to the package. These semiconductor devices are typically a small piece of single crystal silicon or germanium with the electrically active regions on or near one surface and the metallized connections to the active regions on the same surface. This surface is called the "top" or "face" of the "chip."

There are many advantages to turning the chip upside-down and directly connecting the semiconductor to the substrate or package without the use of wires. This technique, commonly called "face bonding" or "flip chip bonding" eliminates undesirable lead inductance, results in a more rugged structure, and reduces assembly time and labor. Techniques for actually attaching the semiconductor to the package or substrate include ultrasonic bonding, thermocompression bonding and soldering.

Regardless of the technique used to attach the semiconductor, it must first be positioned accurately so that the pattern on the underside of the chip is aligned with the pattern on the package or substrate. Since these semiconductors are opague to visible light, this alignment is normally done with mirrors, frequently using an indirect reference like a set of cross-hairs in the microscope.

It is an object of this invention to permit direct viewing of the substrate and the face of the chip through the chip from the back.

It is another object of this invention to eliminate the mirrors and cross-hair referencing of present methods.

It is another object of this invention to simplify the mechanisms for flip chip aligning.

It is another object of this invention to improve accuracy of flip chip aligning.

It is another object of this invention to increase the speed of flip chip aligning.

These and other objects and advantages of this invention will be readily appreciated as the same becomes understood by reference to the following detailed description when considered in connection with the accompanying drawings.

Figure 1:
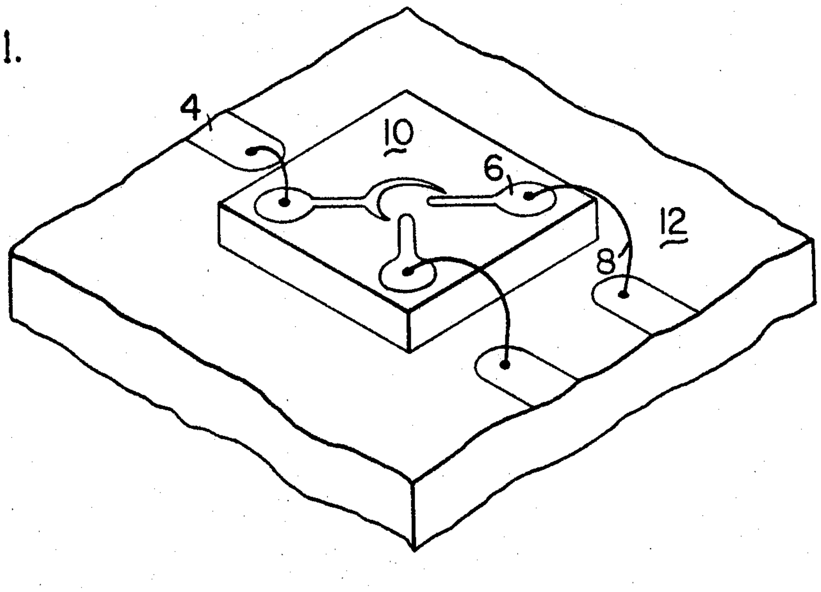

FIG. 1 shows a semiconductor device 10 conventionally mounted face up on a substrate 12 with wires 8 connecting the metallized pattern 6 of the device 10 to the conductors 4 on the substrate.

Figure 2:
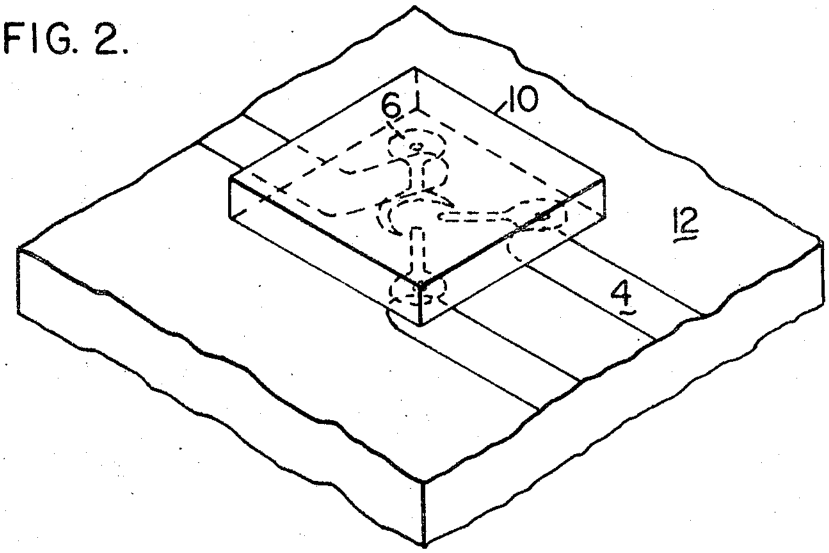

FIGURE 2 shows the same semiconductor device 10 suspended face down over a substrate 12 whose conductors 4 are patterned to mate with the metallized pattern 6 of the device 10.

Figures 3, 4:
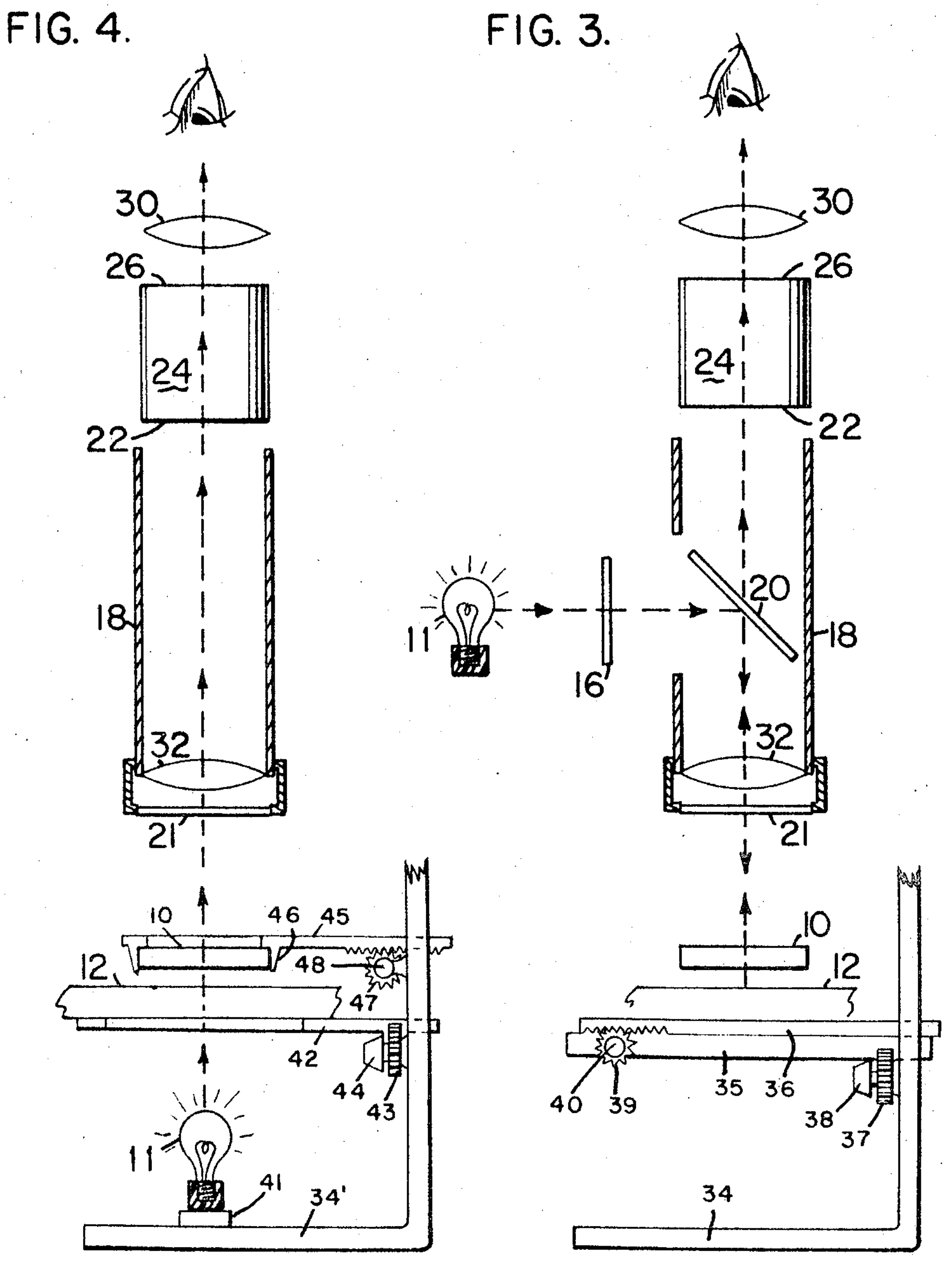

FIGURE 3 is a schematic representation of one embodiment of this invention wherein the semiconductor chip 10 is held face down above the substrate 12. An infra-red beam of light from a source 11 passes through a filter 16 and then into the body of the microscope 18 where a partially reflecting mirror 20 at a suitable angle reflects approximately half of the infra-red beam down toward the semiconductor chip 10 through a second filter 21 mounted on the microscope 18. The semiconductor 10 transmits the infra-red, permitting the pattern on the underside of the chip as well as the pattern on the package or substrate to be illuminated by the infra-red light. The reflection of the infra-red back into the microscope 18 results in the formation of an infra-red image on the cathode 22 of the image converter 24. The image converter 24 converts the infra-red image at the cathode 22 to a visible image at the anode 26, which visible image can be clearly viewed through microscope eyepieces 30 or a viewing screen.

The semiconductor 10 is then moved with respect to the substrate 12, or vice-versa, by suitable mechanical means, until they are properly aligned. One such mechanical means comprises a base 34 in FIG. 3, with two members 35 and 36 adjustably connected to the base. A pinion 37 is rotatively attached to the base and meshes with rack teeth cut into the member 35. This provided motion in the direction in and out of the plane of the paper in the drawing of FIG. 3. A knob 38 allows manual adjustment of the position of the member 35. A second member 36 is slidably mounted above member 35. A pinion 39 is rotatively attached to member 35 and meshes with rack teeth cut into the member 35. This provides motion in motion in FIG. 3. A knob 40 allows manual adjustment of the position of member 36. Each of the members is slideably engaged in the right vertical part of the base 34. This provides two-dimensional adjustment of the position of the substrate 12, allowing proper alignment between it and the semiconductor 10. The arrangement shown in FIGURE 3 can be used regardless of the nature of the package or substrate.

FIGURE 4 is a schematic representation of a second embodiment of this invention which can be used when the package or substrate is transparent to infra-red. The infra-red source 11 is directly below the substrate 12 on the means to position the same 41 so the infra-red light comes directly through the substrate 12, then through the chip 10, through a filter 21 and into the microscope 18 where the infra-red images of the chip and substrate patterns are focused on the cathode 22 of the image converter 24. The image converter 24 converts the infra-red image at the cathode 22 to a visible image at the anode 26 which may be viewed by an operator or photoelectric control instrumentative scope eyepieces or viewing screen. In some cases, the anode image may be viewed directly. If the photoelectric control instrumentation is used without a human operator, it may be necessary to convert the infra-red image to visible.

If the image converter has the usual S1 response curve, the infra-red source should be strong between .75 and 1.1 microns. Xenon and incandescent lamps are two suitable sources. The image converter tube must be shielded from extraneous light such as the visible light which would reflect from the back of the semiconductor or from room light. The filters 16 and 21 remove the extraneous light. They may be any filter that transmits from .75 micron out to 1.1 microns without transmitting visible or ultraviolet, but the most efficient filter is a very thin piece of the same material as the semiconductor. This is usually silicon. A very good procedure is to coat either the objective 32 of the microscope 18 or the partially reflecting mirror 20 with silicon, by vacuum sputtering. In the latter case, the sputtered silicon can perform the reflecting function as well as the filtering function. However, pieces of silicon, suitably mounted, will also serve.

Mechanical means for moving the semiconductor 10 with respect to the substrate 12 in FIG. 4 is similar to that shown in FIG. 3. A base 34′ supports a member 42 with a pinion 43 attached to the base and meshing with rack teeth cut into the member 42. This provides motion in the direction in and out of the plane of the paper in FIG. 4. A knob 44 allows manual adjustment of the position of member 42, to which the substrate 12 is attached. A second member 45 is slideably mounted in the base 34′ and has a clamp 46 to hold the semiconductor 10 from above. A pinion 47 is attached to the base and meshes with rack teeth cut in the second member. This provides right and left motion in FIG. 4. A knob 48 allows manual adjustment of the position of member 45.

I claim:

1. The method of aligning a semiconductor device with a substrate, each of which have an opaque pattern, which includes the steps of;

(a) facing said device to said substrate with said patterns on the sides of each that are adjacent,
(b) illuminating said device and said substrate, inincluding said opaque pattern of each, with infra-red light which passes through said device,
(c) forming an infra-red light image of said patterns,
(d) converting said infra-red light image to a visible image, and
(e) mechanically manipulating said device relative to said substrate while viewing the visible images to accomplish the alignment sought.

2. The method of claim 1 in which;

(a) said infrar-red light image is formed by infra-red light that is reflected from said opaque patterns.

3. The method of claim 1 in which;

(a) said infra-red light image is formed by infra-red light that has passed through said substrate and through said device adjacent to said opaque patterns.

4. Apparatus for aligning a semiconductor device (10) with a substrate (12), each having an opaque pattern (6), (4), comprising;

(a) a source (11) of infra-red light having a wavelength of the order of one micron, (b) means for causing said infra-red light to pass through the semiconductor material of said device,
(c) means to convert (24) an infra-red light image to a visible light image,
(d) a lens (32) for focusing an infra-red light image of both said opaque patterns (6) and (4) upon said means to convert (24) to accomplish the conversion of the light, and
(e) means to move said semiconductor device (10) with respect to said substrate (12), whereby said device and said substrate may be aligned by observing the relative positions of said opaque patterns.

5. The apparatus of claim 4 in which;

(a) said means (20) for causing said infra-red light to pass through the semiconductor material is a partially reflecting mirror oriented to reflect infra-red light substantially normal to the surface of said semiconductor device, and to pass infra-red light reflected from the pattern of said semiconductor device.

6. The apparatus of claim 4 in which;

(a) said means for causing said infra-red light to pass through the semiconductor material is a means to position said infra-red source (11) below said substrate,
whereby said infra-red light passes through both said substrate and said semiconductor device.

7. The apparatus of claim 4, which additionally includes;

(a) elements of a microscope (18) in optical relation to said lens (32)
whereby an enlarged infra-red image is formed of said opaque patterns (6) and (4).

8. The apparatus of claim 4, which additionally includes;

(a) an infra-red pass filter (21) disposed adjacent to said lens (32) on the side thereof toward said semiconductor device (10),
whereby visible light is excluded from said lens.

References Cited

UNITED STATES PATENTS

| | | | |
|---|---|---|---|
| 3,099,579 | 7/1963 | Spitzer et al. | 250—83.3 X |
| 2,920,205 | 1/1960 | Choyke | 250—83.3 |
| 3,109,932 | 11/1963 | Spitzer | 250—83.3 |
| 3,017,512 | 1/1962 | Wolbert | 250—83.3 |

RALPH G. NILSON, Primary Examiner

D. L. WILLIS, Assistant Examiner

U.S. Cl. X.R.

250—213; 356—51